United States Patent [19]
Tennant

[11] Patent Number: 6,043,496
[45] Date of Patent: Mar. 28, 2000

[54] METHOD OF LINEWIDTH MONITORING FOR NANOLITHOGRAPHY

[75] Inventor: Donald Milan Tennant, Freehold, N.J.

[73] Assignee: Lucent Technologies Inc., Murray Hill, N.J.

[21] Appl. No.: 09/039,213

[22] Filed: Mar. 14, 1998

[51] Int. Cl.$^7$ .............................. G21K 5/10; G03F 7/20
[52] U.S. Cl. ................................ 250/492.1; 250/492.2; 250/492.22
[58] Field of Search .............................. 250/492.1, 492.2, 250/492.22

[56] References Cited

U.S. PATENT DOCUMENTS

Re. 36,113  2/1999  Brueck et al. ........................... 430/311

Primary Examiner—Edward P. Westin
Assistant Examiner—Nikita Wells

[57] ABSTRACT

The specification describes a spatial autocorrelation technique for measuring ultrafine linewidths of the order of tens of nanometers and less. Two beams of actinic radiation are used to draw parallel lines in a resist material. Each beam is adjusted to deliver a dose below the threshold for printing a feature, but when combined the dose is sufficient to print a line feature. During exposure the separation between beams is changed in controlled spatial steps until the beams cross one another. During some of the steps at least a portion of the beams will be coincident thus producing printable features. The resist is developed to print the features where the beams are coincident. The lines are below the resolving power of an optical microscope but their presence is discernible. The width of the line is determined from the number of lines printed and the size of the spatial steps.

19 Claims, 2 Drawing Sheets

Spacing Equals:

| 4 Units | 3 Units | 2 Units | 1 Unit | 0 Units |

Spacing Equals:

| 4 Units | 3 Units | 2 Units | 1 Unit | 0 Units |

METHOD OF LINEWIDTH MONITORING FOR NANOLITHOGRAPHY

FIELD OF THE INVENTION

This invention relates to methods for measuring very fine lines and is useful for monitoring lithography tools in the manufacture of semiconductor devices.

BACKGROUND OF THE INVENTION

Linewidth monitoring and control in lithography is a major concern for the semiconductor processing industry. Enormous equipment investment is needed in order to measure critical dimensions of the ultrafine features used in processing semiconductor devices. Lithographic printing steps in these processes are typically practiced using ultraviolet (UV) or deep ultraviolet (DUV) projection photolithographic patterning methods. Measuring the lines which these tools are capable of printing is increasingly difficult especially in view of the rapid pace at which the linewidths are shrinking.

In the manufacture of integrated circuits (ICs), patterns which are replicated onto semiconductor wafers are generally reduction printed from nX reticles (where n is typically 4 but can range from 1 to 20). The reticles are usually produced using electron beam lithography, in which either a round beam or a variable shaped rectangular beam of electrons is scanned over a resist-coated mask blank to expose the needed pattern. Linewidth control in reticle production has important consequences for control of the critical dimensions of the mask features, which are ultimately transferred to production wafers. Mask or reticle production is therefore another related industry for which linewidth monitoring is critical.

For a smaller segment of the semiconductor industry, the critical lithographic exposure is performed directly by a serial writing method such as electron beam lithography. These processes are generally referred to as direct-write processes. Such processes are often restricted to research use by cost and throughput limitations. However, techniques for improving the efficiency of direct-write processes are being sought, and linewidth measuring and control of the ultra fine features made using these processes will be essential for them to have significant commercial impact.

In each of the lithography industry sectors described above, an aerial image of actinic radiation is made incident on a resist material. The resist material is subsequently subjected to thermal and chemical treatment to produce the resultant resist profile. Because this is a multi-step process, many factors can and do cause variations in the dimensions of the features in the resist profile. For example, focus of the printing or writing tool, variations in resist baking temperatures and times, resist aging, time lapses between resist application and exposure and between exposure and post-exposure bake, and exposure dose variations, are all factors which can alter the resulting linewidth. It is therefore critical to monitor the final lithographic outcome as part of any quality control procedure.

In each of the application areas described above, considerable time, effort, and resources, are consumed in the inspection phase of the quality assurance process. Other high precision aspects relating to quality control measurements can be performed routinely using relatively low resolution inspection methods. For example, simple Vernier rulings are used to measure the level-to-level overlay accuracy in both UV lithography and electron beam lithography. The Vernier rulings have relatively large patterned features that can be viewed using an optical microscope, and it is relatively straightforward for an operator or automated video monitor to judge which of several rectangular features are most closely aligned. This simple procedure can determine the overlay error to within 0.05 $\mu$m, about eight-fold smaller than the nominal diffraction limited resolution of the optical microscope.

Another example of monitoring for fine feature control is the use of Moire patterns to evaluate small magnification errors, distortions, and beam drift in electron beam writing tools. See, e.g., B. Hubner and H. W. P. Koops, *J. Vac. Sci. Technol.*, B10 (1992), and references therein. In this method, tilted gratings or gratings of differing periods are overlays to produce "beat" patterns. These patterns can be used to measure small errors or changes, and are observable in an optical microscope.

The monitoring of critical dimensions has, however, been accomplished by more direct measurements using imaging methods with resolving power much finer than the features measured. This need to image and measure ever smaller linewidths has forced technology shifts in the measuring instruments, originally based on optical microscopy and migrating to scanning electron microscopy (SEM) and, more recently, atomic force microscopy (AFM).

A related time-domain problem was posed by the ultrafast laser pulse community in the late 1960s. The goal in that work was to measure the duration of a sub-100 picosecond pulse of light produced by a laser, a time scale too short to measure directly. One solution, described by H. P. Weber in *J. Appl. Phys.* 38, 2231 (1967) and 39, 6041 (1968), is known as the Second Harmonic Generation (SHG) Autocorrelation method. In this scheme the light beam is split and the two half-intensity beams are routed through different free space paths, one beam variably delayed with respect to the other. The two pulse beams are then reunited and passed through a non-linear optical medium capable of second harmonic generation. A detector tuned to the second harmonic radiation is then able to measure the overlap of the initial and delayed pulses. The waxing and waning of the second harmonic radiation intensity as the path length of the delayed beam is changed is a measure of the overlap of the two pulses. Using the path length changes to calibrate the time scale ($\Delta t = \Delta d / c_{air}$) the correlation function is obtained, from which the pulse width is inferred.

It is evident from this background that a simple indirect method of inspection using an optical microscope for measuring and monitoring critical dimensions would enjoy widespread use in industries such as the semiconductor industry, and could provide routine non-invasive feedback for lithographers. The problem is to find that indirect optical method for determining sub-resolution linewidths.

SUMMARY OF THE INVENTION

I have discovered a spatial autocorrelation technique for ultrafine line monitoring. It relies on three key observations:

1. that optical microscopy inspection methods allow detection but not measurement of features significantly smaller than the resolving power of the microscope (usually given by $1.22\lambda/2NA$);
2. that photoresist exhibits a highly non-linear development response when exposed to its actinic radiation; and
3. that interferometrically controlled writing systems, such as electron beam lithography systems, have highly precise positioning capability which ultimately can serve as a linewidth measurement standard.

The spatial autocorrelation method of the invention is implemented by exposing a resist coated sample (mask, wafer, etc.) to a first image of a simple geometric pattern typically at half the dose required for printing. The lithography pattern is then moved by a predetermined small distance and the resist is exposed to a second image of the pattern, again at half dose. The predetermined small distance is reduced in stages from a point of total separation between the first and second pattern images, to a point of overlap of the first and second pattern images. A point of overlap will eventually and inevitably be reached if the distance between steps is small relative to the width of the line being monitored. At the point of overlap the pattern will print in the resist, and the printed feature, still smaller than the resolution capability of the optical microscope, can be observed. The width of the line is inferred from the number of consecutive steps that produce an observable feature.

DETAILED DESCRIPTION

Figure 1:
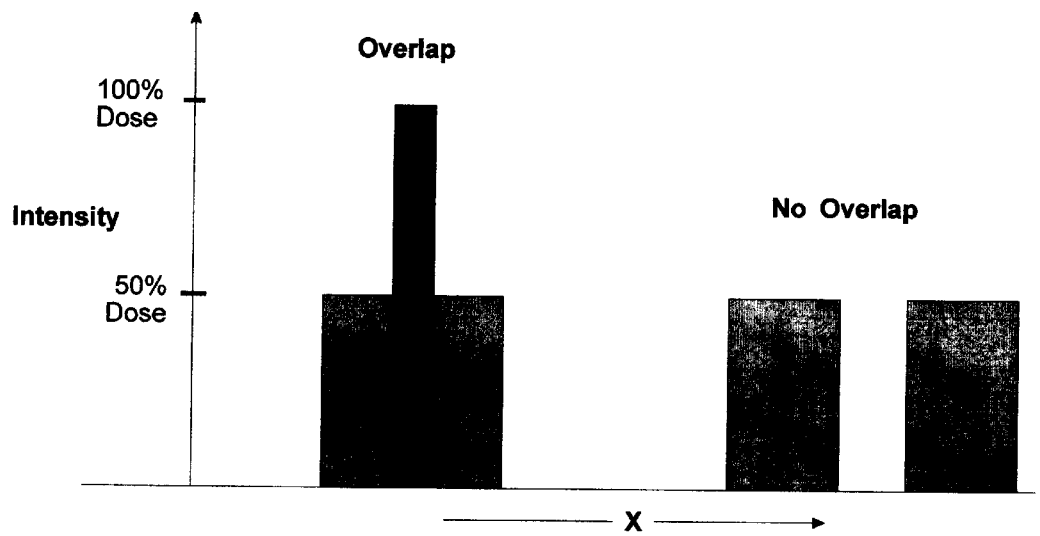
FIG. 1 is a schematic diagram of two lithographic aerial images used to demonstrate the linewidth monitoring technique of the invention.
Figure 2:
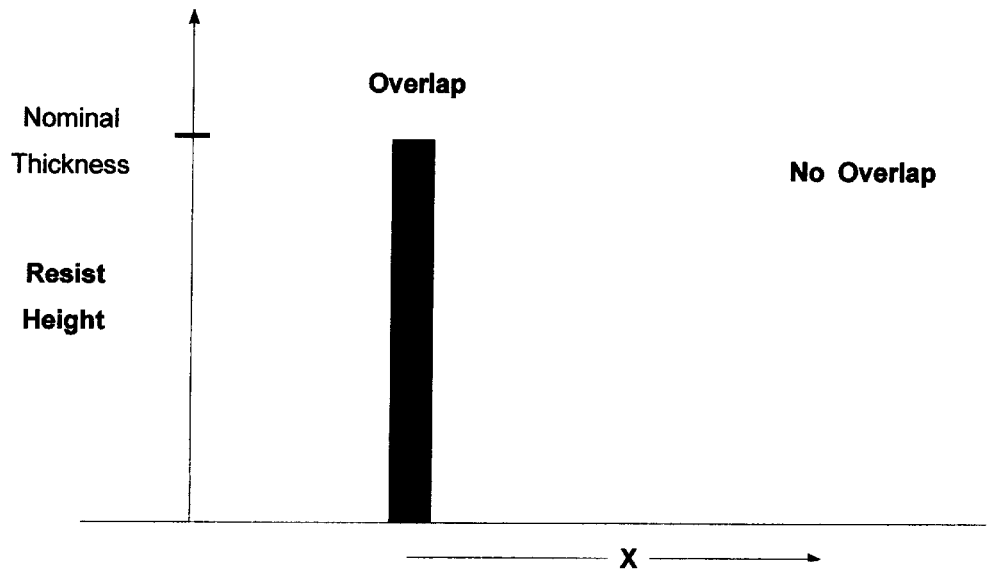
FIG. 2 is a schematic diagram of the resist patterns that are printed from the aerial images of FIG. 1.

FIG. 1 shows the basic mechanism using a simplified example and assumes the case of both an ideal negative photoresist material and an ideal exposure. Two rectangular intensity patterns, A and B, are exposed with a partial overlap (left side) and with no overlap (right side). In the case where the rectangles overlap, there is sufficient dose to fully develop the resist as shown in FIG. 2. In the regions receiving a total of a half dose, rectangles A and B on the right side, the resist completely washes away and, as seen in FIG. 2, there is no remaining resist profile. The presence of the feature shown in FIG. 2 is then detected by simple optical microscopy.

Figure 3:
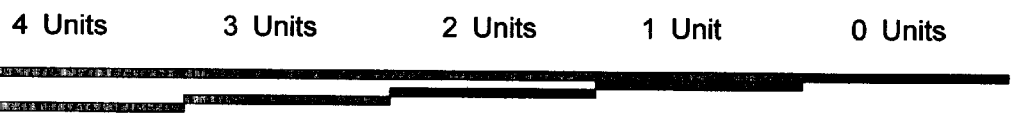
FIG. 3 is a schematic view of lithographic images and printed features showing a thin line measured by the spatial autocorrelation method of the invention.

Based on this principle idea, a standard diagnostic structure can be implemented. With reference to FIG. 3, a series of line exposures are shown, each line exposure being stepped sideways by a precisely controlled distance, here approximately equal to the actual width of the line being measured. When the two line exposures are coincident, at 0 Units spacing, the line prints as indicated by the heavy shading. When the lines are separated by 1 Unit, no line prints. Likewise for separations of 2, 3 and 4 Units no line prints. While the line width is not directly measured, its width can be inferred from the single printed line to be equal to or less than the distance each exposure is stepped. The line being measured in FIG. 3 is a fine line, and can be indirectly measured by the technique of the invention as long as its width is comparable to (actually greater than or equal to) the stepping distance of the monitoring beam. It is also statistically likely that the line will be measured if it is smaller than the stepping distance, but if it is significantly smaller the chance of stepping over the line during application of the technique is large enough to render the technique unreliable. However, it will occur to those skilled in the art that a larger beam stepping distance can be used if the starting point for stepping the beam is adjusted by increments of less than or equal to the line width being measured and multiple stepping sequences are used if necessary.

Figure 4:
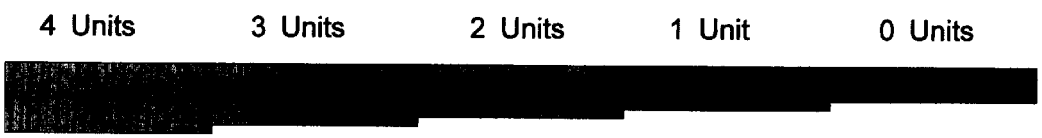
FIG. 4 is a schematic view of lithographic images and printed features showing a thick line measured by the spatial autocorrelation method of the invention.

A similar demonstration is shown in FIG. 4 for a thicker line, i.e. four times thicker than the line measured in FIG. 3. Here the thick line prints when the two beam images are superimposed, and a line continues to print for stepping distances equal to 1, 2 and 3 Units. With a spacing of four Units, no line prints as indicated in the Figure. Thus it is inferred in this case that the line being measured is four Units wide.

Since the stepping distance corresponding to the units in FIGS. 3 and 4 can be precisely controlled over excursions of the order of 10 nm or less—significantly smaller than the feature sizes in state of the art integrated circuits—the spatial autocorrelation technique of the invention is capable of monitoring geometries of IC features and of mask patterns in semiconductor processes in use today. While lines with these dimensions can easily be monitored by this technique, the granularity of the technique is only limited by current practical realities, e.g. the digital placement precision available in currently offered e-beam equipment. This equipment already has extraordinarily fine precision, i.e. 1–5 nm. Linewidths in many commercial processes are significantly larger than just described and applications for the technique may be found in which the spatial increments for the stepping beam range up to 100 nm.

Figure 5:
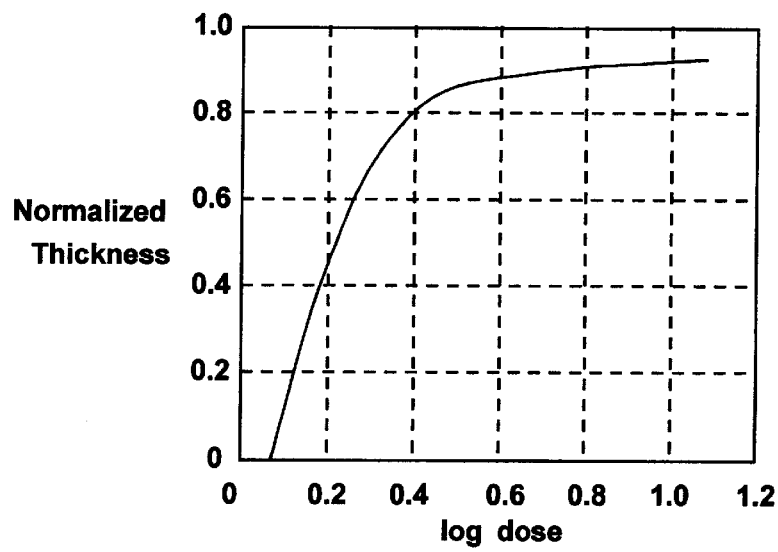
FIG. 5 is a plot of normalized resist thickness of a typical photoresist material vs. log of electron beam dose showing the contrast properties of the resist.

The practical application of the method relies on the non-linear properties of real non-ideal materials. FIG. 5 shows the experimentally determined response curve (aka, sensitivity curve or characteristic curve) for SAL 603, a commercial negative electron beam resist manufactured by Shipley, Inc. The normalized resist thickness remaining after development is plotted as a function of the log of the incident electron beam dose. Such plots are well known in the art, and are characterized by a linear transition region described as follows:

$$t/t_0 = 1 - \gamma \log (D_0/D)$$

where t is the thickness remaining, $t_0$ is the unexposed resist thickness, $\gamma$ is the resist contrast, $D_0$ is the nominal sensitivity of the resist and D is the delivered dose. The nearly step function-like response makes this resist a nearly ideal medium for the spatial autocorrelation technique. The steeper the slope of the linear region of the curve, the easier the implementation. The optimum inspection condition is obtained when the desired film retention is achieved and no resist remains in other areas. From the expression above the minimum resist contrast necessary to permit this condition can be estimated from the relationship:

$$\gamma_{min} = R/0.30$$

where R is the fraction of the original resist thickness retained. Therefore a film retention of 0.8 would require a minimum resist contrast of 2.65, a value readily available among commercial resists using standard developers. The resist/developer system used with SAL 603 to yield the data of FIG. 5, for example, exhibits a resist contrast of 3.4, and other resists with values in the 3–10 range are available. It is noted that, in general, the contrast values measured from the characteristic curves like that of FIG. 5 are valid for smaller features as well. See G. P. Watson et al, *J. Vac. Sci.*

Technol. B14, 4277 (1996). The technique can also be adapted for lower contrast resist/developer systems albeit with possible difficulty in discerning the cutoff between steps.

Actual aerial images produced by typical lithography tools vary from the idealized image used to illustrate the concept in FIGS. 1 and 2. For the case of round or spot beam electron beam lithography, the beam is generally approximated by a Gaussian intensity profile. As the beam penetrates the resist and impacts the substrate, well known scattering mechanisms cause the deposited energy to distribute over a larger spatial area. The resulting dose distribution is somewhat complicated and is highly dependent on the resist thickness and the substrate material. However, for relatively thin resist layers (<1 $\mu$m) and high voltages (50 kV), on silicon substrates, low density patterns such as those proposed here are reasonably well represented by a two Gaussian model. See S. A. Rishton et al, *J. Vac. Sci Technol. B* 5, 135 (1987). A narrow Gaussian approximates the incident beam that is slightly broadened due to inelastic or forward scattering events in the resist layer. A second long range Gaussian is used to represent the energy deposited by backscattered electrons which result from elastic scattering in the substrate. The point spread function is represented as follows:

$$f(r) = \frac{1}{\pi(1+\eta)} \left[ \frac{1}{\alpha^2} \exp\left(\frac{-r^2}{\alpha^2}\right) + \frac{\eta}{\beta^2} \exp\left(\frac{-r^2}{\beta^2}\right) \right]$$

where r is the radial distance from the center of the beam, $\eta$ is the backscatter coefficient (approximately 0.5 to 0.75), $\alpha$ is the half width of the slightly broadened beam, and $\beta$ is the backscatter range (half width) of the elastically scattered electrons. The pointspread function convolved with the pattern gives the aerial image of the exposure.

The technique of the invention was demonstrated assuming a value of $\alpha$=10 nm, $\beta$=9 $\mu$m and $\eta$=0.75, for a single pass line pattern with 25 nm pixel spacings. A series of simulations using three dimensional plots shows two parallel line exposures initially spaced 75 nm apart (center to center spacing), then 50 nm, then 25 nm, then coincident. It was observed that the peak in the exposure intensity is 1 unit high for the 75 and 50 nm spacings, yet it jumps to 2 units for the 25 and 0 nm spacings. If the threshold development model is assumed for the resist development, a value of between 25 and 50 nm is obtained for the measured value. This result can be further refined using smaller steps and finer gradations.

While the foregoing simulations demonstrate the efficacy of the technique for measuring linewidths in nanolithography, the expected measured value cannot be determined a priori from the aerial image alone. Other factors contribute to the actual developed linewidths. For example, developer effects, chemical diffusion rate effects in multi component resists, and resist granularity effects can cause linewidths to be larger than predicted. It is therefore desirable to verify or calibrate the spatial autocorrelation results using a high resolution direct measurement. This will produce an offset value or calibration table which then allows one to obtain quantitative information chip to chip and wafer to wafer as process variations occur.

As demonstrated here, the spatial autocorrelation technique of the invention is a powerful metrology tool for quality control in high resolution lithography. It is most readily implemented in applications where serial writing tools are employed. These include electron beam lithography systems (both Gaussian beam and variable shape beam systems), focused ion beam (FIB) systems, and laser direct-write systems. These system types are best suited to delivering the dose adjustments (e.g. half dose exposures) which is an important ingredient of the technique. The invention can be used in direct deposit and direct etching applications where the process has non-linear characteristics sufficient to produce a large contrast change between the overlapped and non-overlapped regions.

A variation of the method can be used with parallel exposure systems such as UV steppers by adding gray scale or controlled attenuation features to the standard apparatus. The attenuating means can be sub-resolution features or attenuating optical materials such as those used in attenuated phase shifting mask technology (APSM technology) to produce an attenuated feature in a reticle for a UV optical step-and-repeat or step and scan camera. In this connection see B. W. Smith et al, *J. Vac. Sci. Technol.* B14, 3719 (1996) and S. Ito et al, *J. Vac. Sci. Technol. B*14, 4199 (1996). In like fashion, gray tone masks of either the sub-resolution or attenuating variety would allow an electron projection system such as SCALPEL to use the monitoring method of the invention as well.

The technique of the invention as demonstrated used a half dose exposure for the two aerial images. The exposure dose can vary from half dose in either or both beams as long as the combined dose is at least sufficient to print a line feature. For example, one line can be exposed at 30% of nominal full dose, and the other at 70%. Sufficient margins should be maintained to avoid printing features by one beam alone, which suggests that the range be within an 80/20 ratio. Excess combined beam dose, e.g. 60%/60%, would also be expected to be useful but significant excess may produce undesirable line broadening and false results. The combined beam dose can also in principle be less than 100% of the nominal printing dose, e.g. 30%/30%, and a flood beam (at approximately 40% dose) used to reveal the features printed where the 30%/30% beams overlap.

The spatial autocorrelation method of the invention has been described for negative resists. However, it will be understood by those skilled in the art that it may also be used with positive resists following the same basic teachings outlined above.

Exposure beams at less than the nominal printing dose can be obtained by simply adjusting the beam intensity and scan speed, or can be derived from a full power beam by attenuating means as described above. Another option is to use a beam splitting means such as a partially reflecting mirror. If a mirror is used which reflects a portion of the beam at the front surface and a portion of the beam at the back surface the spatial separation between the beams can be adjusted by changing the thickness of the mirror (with the beam off normal), e.g. by using a piezoelectric mechanism.

In the technique as described the reference beam line is fixed while the other line from the stepped beam is stepped in parallel spatial increments with respect to the fixed direction of the first beam. The technique also works if both lines are shifted. In the anticipated use of the invention the distance the stepped beam is shifted is a fraction of the linewidth being measured, e.g. less than one half. The beams are initially separated and arranged to cross over one another and the steps continued past the onset of coincidence to assure that the whole width of the line is monitored. Typically 5–100 steps will be used. The actual linewidth dimensions can be printed on the wafer in the field of view to serve as a ruler so numbers appear next to printed line sites giving the microscope operator a direct indicator of the linewidth.

Since the usual objective for the technique is to monitor the width of lines, the important direction of movement of the stepping beam to be controlled and monitored is the one normal to the line being monitored. However, there are advantages in controlling and monitoring beam movement in both x- and y-directions to reveal, e.g. beam astigmatism, or other variations in the scan of the beam. In this case the background of the field observed by the microscope operator would have an x-y reference grid.

The details of the invention have been described in the context of a beam scanning apparatus of the kind used in scanning lithography systems. The invention can also be practiced with projection lithography in which case the test regions in the resist that are exposed, e.g. rectangle A of FIG. 1, are determined by the lithographic mask. Region B may be exposed by moving the mask or the substrate. In this embodiment the actinic beam is essentially stationary. The essential feature in each case is relative movement between the actinic beam and the resist being exposed to produce multiple exposed regions at least some of which overlap to produce test features.

The two beams, the reference beam and the stepped beam (or the mask features corresponding thereto), are assumed to be approximately the same width in the foregoing description. This would be the normal case when the invention is implemented for lithography applications. However, it will occur to those skilled in the art that the basic technique does not require that both beams have the same width.

In principle the technique can be implemented with images of shapes other than simple lines, e.g. the dots or rectangles produced by a stationary beam. However, in the usual case lines are more easily detected by the optical microscope.

The method of the invention as described uses conventional lithographic techniques and materials. The autocorrelation is made after both exposure and development of the resist images. Variations of the technique may occur to those skilled in the art in applications that don't inherently use photoresist materials and where the photoresist materials are replaced with other light sensitive materials. For example, in a parallel beam arrangement, where both the reference line and the stepped line are written simultaneously, phosphor materials can be used and the incidence of overlap sensed by a change in the brightness of the radiation emitted from the reference line. Such an indicator can be very sensitive and will operate in a sub-resolution mode.

The term actinic radiation as customarily used in the art and as used herein refers to radiation that causes a detectable change in a material exposed to it. The induced change is typically chemical, e.g. crosslinking of polymers in photoresists, but in a broad sense includes optical phenomena such as photoluminescence. The radiation can be light, e-beam, ion beam, x-ray etc. The term photoresist and photolithography is used as a generic term to refer to lithographic materials sensitive to light, electrons, ions or x-rays. The term microscope refers in the preferred case to an optical microscope but can also be an electron microscope or other suitable device for detecting small features.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A method for measuring the width of a beam of actinic radiation said beam having a width w of less than 100 nm comprising the operations of:
   a. exposing a first portion of a layer of radiation sensitive material with said beam of actinic radiation, thereby producing a first exposed image with an exposure dose $D_1$,
   b. exposing a second portion of said layer of radiation sensitive material with a said beam of actinic radiation, thereby producing a second exposed image with an exposure dose $D_2$,
   c. moving said beam by a predetermined distance S equal to or less than the width w of the beam,
   d. exposing a third portion of said layer of radiation sensitive material with said beam, said third portion and said first portion at least partially overlapping thereby producing an overlapping region with an exposure dose of $D_1+D_2$, the exposure in said overlapping region producing an actinic response in said radiation sensitive layer that is visibly discernible from the actinic response produced by said first and second exposed images.

2. The method of claim 1 wherein dose $D_1$ and dose $D_2$ are approximately equal.

3. The method of claim 1 wherein the distance S is less than 100 nm.

4. The method of claim 3 wherein the distance S is less than 25 nm.

5. The method of claim 1 wherein the radiation sensitive material is a resist.

6. The method of claim 5 in which the actinic radiation is UV light.

7. A method for measuring the width of a beam of actinic radiation said beam having a width of less than 100 nm comprising the operations of:
   a. scanning a layer of resist with said beam of actinic radiation in a first scanning direction, thereby producing a first exposed line image with an exposure dose $D_1$, said dose $D_1$ being less than the dose required for printing a feature in said resist,
   b. scanning said layer of resist with said beam of actinic radiation in a direction essentially parallel to said first scanning direction, thereby producing a second exposed line image with an exposure dose $D_2$, said exposure dose $D_2$ being less than the dose required for printing a feature in said resist but being sufficient when combined with dose $D_1$ to produce a feature in said resist,
   c. scanning said layer of resist with said beam of actinic radiation in a direction essentially parallel to said first scanning direction, thereby producing a third exposed line image with an exposure dose $D_2$, said third exposed line image being spaced from said second exposed line image by a distance S equal to or less than the width of the line being measured,
   c. repeating step b. to produce a series of exposed line images parallel to said first scanning direction, and wherein at least one of said series of exposed line images at least partially overlaps said first exposed line image thereby producing an exposure region having a dose $D_1+D_2$ and sufficient to print at least one line feature in said resist,
   d. developing said resist to print said at least one line feature,
   e. viewing said series of exposed line images with a microscope to determine the number of line features printed.

8. The method of claim 7 wherein dose $D_1$ and dose $D_2$ are approximately equal.

9. The method of claim 7 wherein the resist is a photoresist and the actinic radiation is UV light.

10. The method of claim 7 wherein the distance S is less than 100 nm.

11. The method of claim 10 wherein the distance S is less than 25 nm.

12. A method for measuring the width of a beam of actinic radiation said beam having a width w of less than 100 nm comprising the operations of:

a. exposing a first portion of a layer of radiation sensitive material with said beam of actinic radiation, thereby producing a first exposed image with an exposure dose $D_1$, b. exposing a second portion of said layer of radiation sensitive material with a said beam of actinic radiation, thereby producing a second exposed image with an exposure dose $D_2$, c. exposing a third portion of said layer of radiation sensitive material with said beam, said third portion and said first portion at least partially overlapping thereby producing an overlapping region with an exposure dose of $D_1+D_2$, the exposure in said overlapping region producing an actinic response in said radiation sensitive layer that is visibly discernible from the actinic response produced by said first and second exposed images.

13. The method of claim 12 wherein dose $D_1$ and dose $D_2$ are approximately equal.

14. The method of claim 12 wherein the distance S is less than 100 nm.

15. The method of claim 14 wherein the distance S is less than 25 nm.

16. The method of claim 12 in which the exposures are made by projecting a beam of actinic radiation through a mask.

17. The method of claim 12 in which the beam is a single scanning source of actinic radiation.

18. The method of claim 12 in which the radiation sensitive material is a resist.

19. The method of claim 12 in which the actinic radiation is UV light.

* * * * *